United States Patent
Ramakrishnan

Patent Number: 5,943,580
Date of Patent: Aug. 24, 1999

[54] METHOD OF FORMING A CAPACITOR OR AN INDUCTOR ON A SUBSTRATE

[75] Inventor: E. S. Ramakrishnan, Coral Springs, Fla.

[73] Assignee: Motorola, Inc., Schaumburg, Ill.

[21] Appl. No.: 08/990,275

[22] Filed: Dec. 15, 1997

[51] Int. Cl.⁶ .............................. H01G 4/00; H01F 41/00
[52] U.S. Cl. .................... 438/381; 438/393; 29/25.42; 361/322
[58] Field of Search .................................. 438/238, 239, 438/240, 250, 381, 393; 29/25.41, 25.42; 361/301.1, 322, 313

[56] References Cited

U.S. PATENT DOCUMENTS

| | | |
|---|---|---|
| 4,026,811 | 5/1977 | Readey et al. . |
| 4,471,405 | 9/1984 | Howard et al. .......................... 361/305 |
| 5,083,236 | 1/1992 | Chason et al. .......................... 361/401 |
| 5,122,923 | 6/1992 | Matsubara et al. . |
| 5,587,870 | 12/1996 | Anderson et al. . |

*Primary Examiner*—Charles Bowers
*Assistant Examiner*—Keith Christianson
*Attorney, Agent, or Firm*—Dale W. Dorinski

[57] ABSTRACT

High dielectric constant capacitors and/or inductors are formed on a substrate by depositing an amorphous layer (10) of a metal oxide on the substrate (12). A pattern is formed in the metal oxide by wet or dry etching to remove portions (17) of the amorphous material so that only portions (18) of the substrate remain covered. This pattern subsequently becomes the dielectric portion of the capacitor or the inductor. The patterned amorphous layer of metal oxide is then heated under conditions sufficient to convert it from amorphous to crystalline (16), thus increasing the dielectric constant.

14 Claims, 2 Drawing Sheets

METHOD OF FORMING A CAPACITOR OR AN INDUCTOR ON A SUBSTRATE

TECHNICAL FIELD

This invention relates in general to methods of forming capacitors and inductors on semiconducting substrates and more particularly of forming capacitors or inductors having insulating films with high-dielectric constants and permeabilities.

BACKGROUND

In addition to transistors, components such as capacitors and inductors can be formed on either semiconducting or conventional substrates. In these types of devices, a dielectric film must be patterned on the substrate in order to isolate the capacitor/inductor and minimize stray capacitance. In the case of alumina ceramic ($Al_2O_3$) conventional dielectric materials are used and are patterned using conventional wet and dry etch methodology. Similar methods are also used in the case of semiconducting substrates such as silicon and gallium arsenide (GaAs). It is highly desirable to have a dielectric film that has a high dielectric constant (K), since devices can then be made smaller and will have a wider range of values. However, the highly crystalline nature of high K dielectrics (and also ferroelectric and magnetic oxides) dictates that conventional etching methods such as chemical etching and wet etching are not especially useful. Crystalline materials are highly structured and very resistant to chemical and gaseous etchants. Thus, the use of high K crystalline dielectrics has been extremely limited in the art, and practitioners have been forced to limit themselves to non-crystalline, i.e., amorphous (example, $SiO_2$), materials that have a significantly lower dielectric constant. Because of their non-structured nature, amorphous films are significantly easier to etch, both chemically and using plasma etch, and have found favor in the industry.

It would be highly desirable if a method could be devised to use conventional patterning and etching techniques in order to create high K capacitors and inductors.

DETAILED DESCRIPTION OF THE PREFERRED EMBODIMENT

Figure 1:
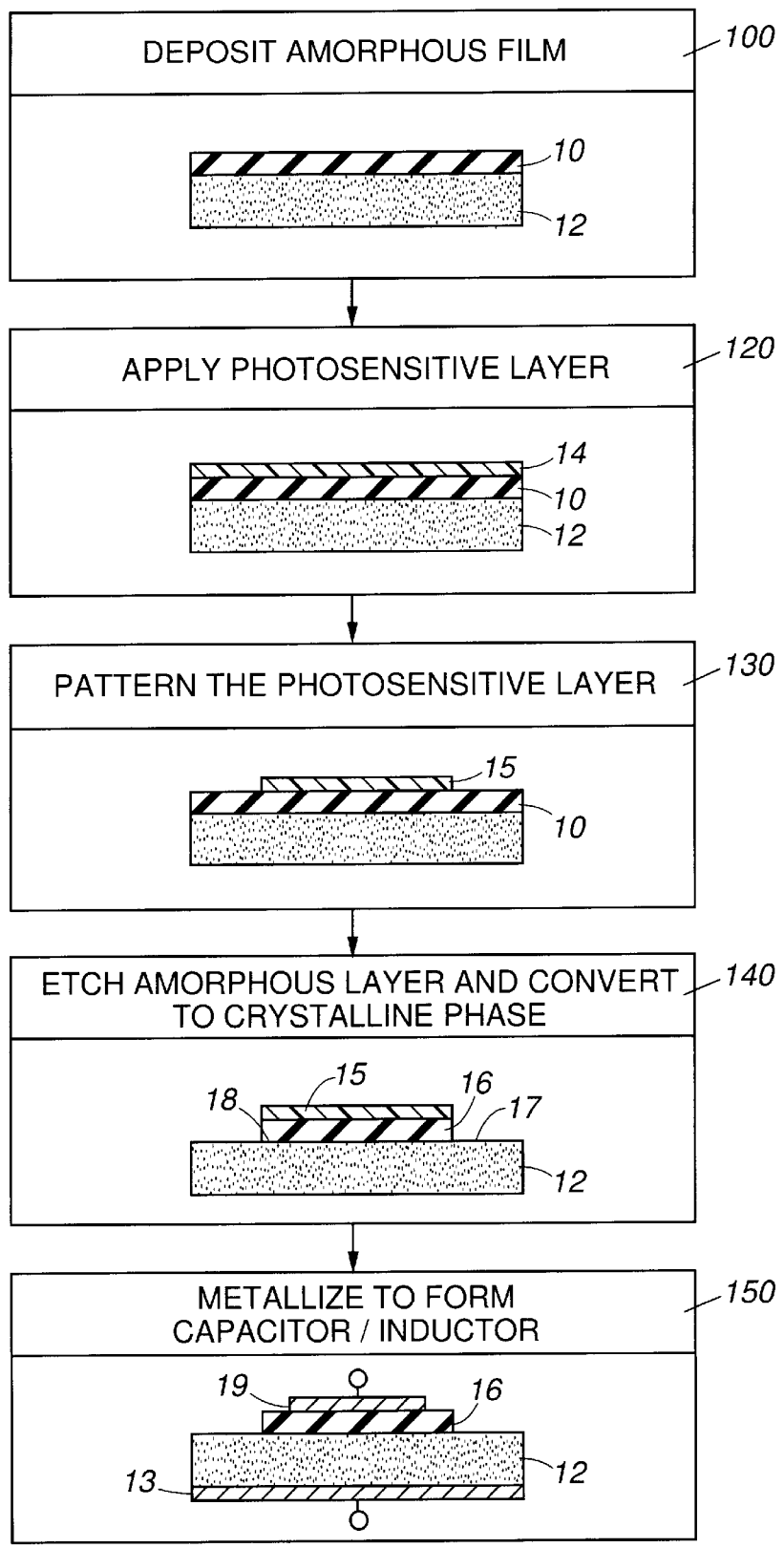
FIG. 1 is a process flow diagram showing the steps of forming a high dielectric constant capacitor or inductor in accordance with the invention.

A method of forming a capacitor or an inductor on a substrate comprises providing a substrate, depositing an amorphous layer of a metal oxide on the substrate, and forming a pattern in the oxide layer while it is still in the amorphous state. The patterned metal oxide subsequently becomes a dielectric portion of the capacitor or the inductor. The patterned metal oxide is then heated under conditions sufficient to convert it from amorphous to crystalline, typically anywhere from 600–1000° C. Appropriate metal conductors are applied over the crystalline metal oxide to form the device.

High K dielectric film (for capacitors) and high permeability ($\mu$) thin films (for inductors) can now be formed on silicon and gallium arsenide substrates. Thin films of interest that exhibit the desired properties typically have a very high degree of crystallinity. However, these crystalline films cannot be patterned by conventional methods, because they are very resistant to the etchants used. In their amorphous state (i.e. non-crystalline) these same films have significantly lower K and $\mu$ values compared to the same materials in a crystalline state. However, amorphous oxide films can be easily patterned and etched using conventional wet chemistry. By depositing the film on a substrate in an amorphous phase and patterning the film while in that phase, and then converting the film to a crystalline phase by heating or annealing, we have been able to create capacitors and inductors having high dielectric constant and high permeability oxide films.

Amorphous dielectric films of interest are the metal oxides, such as $ZrTiO_4$, $(SnZr)TiO_4$, $NiFe_2O_4$, $(NiZn)Fe_2O_4$ or $BaFe_2O_4$. When these materials are deposited on a substrate at temperatures significantly below the crystallization temperature, they remain in the amorphous state. By subjecting these amorphous films to a high-temperature post-anneal, the films are converted into stable and crystalline phases that have a high K and/or a high $\mu$. Deposition in the amorphous phase is achieved using, for example, a low-temperature sputter deposition process from a target material having the same stoichiometry as the finished film. The films are patterned using photolithography followed by wet chemical etching. They are then post-annealed in a furnace or other rapid thermal processing methods to convert them from their amorphous state to the respective crystalline phases, resulting in significantly improved electrical properties. The conversion from amorphous to crystalline phase in the patterned films has been confirmed by X-ray diffraction anaylasis.

In one example, we deposited a film of $ZrTiO_4$ on a substrate in an amorphous form, and measured the dielectric constant to be approximately eighteen. In this form, $ZrTiO_4$ film was easily patterned using wet chemistry, and after post-annealing at 700–850° C., it was converted to the crystalline form and the dielectric constant increased from eighteen to thirty-five. In a second instance, we achieved similar results using a film of $(SnZr)TiO_4$.

The method of the instant invention can be used for developing many high K metal oxide films, such as strontium titanate ($SrTiO_3$), barium strontium titinate ($Ba_xSr_{1-x}TiO_3$), tin zirconium titinate (Zr:Sn) $TiO_4$, or ferroelectrics such as lead zirconium titanate (PZT). Each of these materials can be deposited in amorphous form at low temperatures and chemically patterned using wet or dry etching. When followed by a post-annealing step, the amorphous materials are converted to corresponding crystalline phases with attendant increases in the dielectric constants. Magnetic oxides, i.e. ferrites, like nickel iron oxide $NiFe_2O_4$, barium iron oxide $BaFe_2O_4$, or nickel zinc iron oxide $(NiZn)Fe_2O_4$ can also be processed with similar results. This technique is equally applicable not only to films that are sputter deposited, but films that are formed by other techniques such as sol-gel, metal organic deposition, evaporation, and chemical vapor deposition.

In an alternate embodiment of the invention, the integration of low K and high K capacitors on the same substrate can now be achieved using our invention. Selected area thermal treatment, for example, laser annealing, of only a portion of the patterned dielectric film will produce areas of high K (crystalline) and areas of low K (amorphous) in the same layer. Capacitors can now be formed on a single substrate that have different capacitance per unit area. Another extension of this technique and still another embodiment can be achieved by depositing the amorphous film, patterning and annealing to achieve high dielectric constant, then following with a second step of depositing another layer of the same amorphous material and patterning, but not invoking the annealing step. In this way, capacitors with a high dielectric constant and a lower dielectric constant can be formed on the same substrate. It should also be obvious to the reader that the thermal treatment can be modified to only partially convert the amorphous material to a crystalline phase, rather than going to 100% crystalline. By so doing, one is now able to create capacitors with a wide range of dielectric constants on a single substrate. For example, if the amorphous material has a dielectric constant of 18 and the crystalline material has a dielectric constant of 35, it should be obvious that dielectric constants between 18 and 35 can be achieved by controlling the thermal treatment process such that only a partial degree of crystallinity is achieved.

Having now described the invention, it is believed that the invention will be better understood from a consideration of the following description in conjunction with the drawing figures, in which like reference numerals are carried forward. The process steps of the preferred embodiment of the invention will first be reviewed with reference to FIG. 1. An amorphous film of a metal oxide 10 is deposited (step 100) on a substrate 12 such as silicon, gallium arsenide or alumina ceramic. Typically, a layer of photosensitive material 14 is then deposited or layered (step 120) over the amorphous film 10. The photosensitive layer is then patterned (step 130) using conventional techniques such as photolithography in order to form a pattern 15 on the surface of the amorphous film 10. After forming the pattern in the photosensitive layer, portions of the amorphous film are now exposed or revealed, and those portions are subsequently etched (step 140) using wet chemistry or plasma etching to remove the revealed portions of the amorphous film. The result of this step is that portions 17 of the surface of the substrate 10 are now revealed and other portions 18 of the substrate remain covered with the amorphous film. If the photosensitive material is an organic polymer such as a photoresist, it is then removed and the etched amorphous film is thermally treated (step 140) at temperatures of 600–1000° C., more preferably 700–850° C., in order to convert the amorphous pattern 15 into a crystalline phase 16. In one embodiment, the entire substrate including the patterned film, is heat treated in order to convert the film to the crystalline phase. In another embodiment, only selected portions of the etched pattern of the amorphous film are exposed to the thermal treatment whereas the remaining portions do not receive thermal treatment. One way of achieving this is by laser annealing, for example, where a laser beam is used to thermally excite the selected portions of the amorphous film. The result of selective annealing is that those areas that were selectively heated are converted into a crystalline state with the attendant increase in dielectric constant, whereas those areas that are not heated remain in the amorphous state with a low dielectric constant. In order to complete the formation (step 150) of a capacitor, a metal layer or conductor 19 is formed over the crystalline film 16 and a second layer of metal 13 is formed on the opposite side of the substrate 10 in order to form the second plate of the capacitor. Metal pattern 19, metal layer 13, crystalline film 16, and substrate 12 now comprise the high dielectric constant capacitor.

Figure 2:
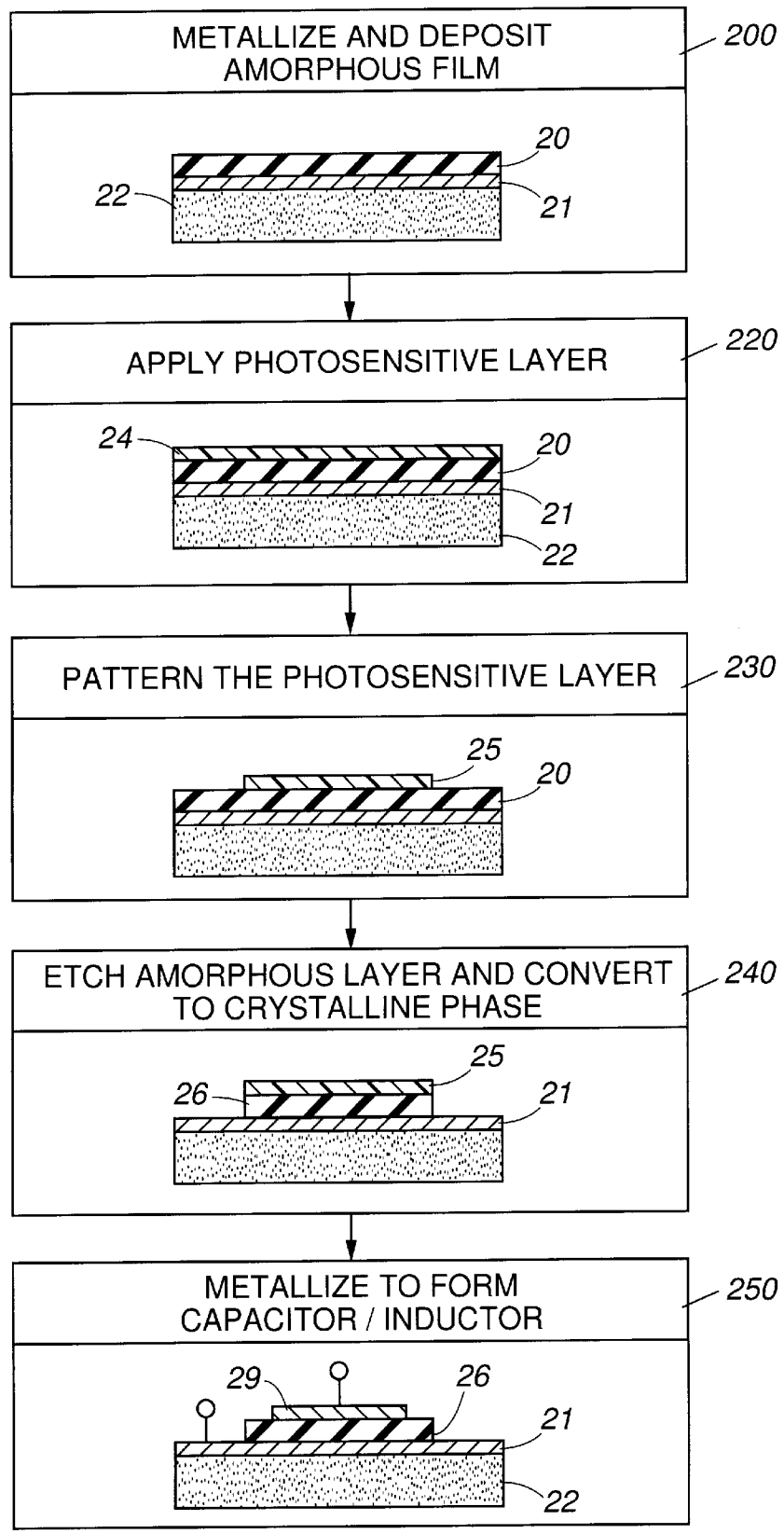
FIG. 2 is a process flow diagram showing the steps in an alternate embodiment of FIG. 1.

An alternate embodiment of the invention is shown in FIG. 2. The first step 200 comprises forming a layer of metal 21 on the substrate 22. The amorphous metal oxide film 20 is then deposited over the metal layer using techniques previously described. As in previous embodiments, a photosensitive layer 24 is then layered (step 220) on top of the amorphous film and a pattern 25 is formed (step 230) in the photosensitive layer. The amorphous film is then etched (step 240) using wet chemistry or dry etching, such as plasma, to form a pattern in the amorphous film. Although the drawing figures show that the metal layer 21 is not etched at this point, this is an optional step and depending upon the design configurations desired, the metal layer 21 may or may not be etched. As in previous embodiments, the patterned photosensitive layer 25 is then removed and the patterned amorphous film is then subjected to thermal treatments sufficient to convert the amorphous material into the desired degree of crystallinity 26. In order to form (step 250) a capacitor or inductor a second metal layer 29 is deposited or formed atop the patterned crystalline film and the high dielectric constant capacitor now comprises metal layer 29, crystalline film 26, and metal layer 21.

It should be obvious to the reader that similar process flows can be employed in order to create inductors with high dielectric or high permeability on substrates. Appropriate alteration of the metallization, patterning and/or etching steps will create the desired structures and these modifications should be well known to those skilled in the art.

In summary, novel methods for fabricating capacitors and/or inductors using dielectrics of oxide films having high K and high $\mu$ values have been disclosed. In contrast to prior art methods which use silicon dioxide (dielectric constant of 3.9) to form capacitors in planar structures, we have achieved capacitors with dielectric constants as high as 35 or more. Since capacitance is equal to:

$$C=(Ka)/T$$

where C is capacitance, K is dielectric constant, a is area, and T is the thickness of the dielectric film, the only option available to increase the capacitance in the prior art has been to reduce the film thickness of the dielectric or to increase the size of the device. By increasing the dielectric constant, we have been able to achieve capacitors of higher values without having to make the sacrifice of increased area or decreased film thickness.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, in an alternate embodiment, the pattern can be achieved in the amorphous film by using a mask during the step of depositing or sputtering the amorphous metal oxide onto the substrate. If the appropriate mask is used, such as a shadow mask, the photosensitive layer 14, 24 and the subsequent patterning of the photosensitive layer would obviously not be employed. The thermal treatment of the amorphous material is typically carried out in an oxygen-containing atmosphere. However, this is not a requirement and, if desired, the practitioner may choose to employ inert gases.

What is claimed is:

1. A method of forming a capacitor or an inductor on a substrate, comprising:

providing a substrate;

depositing an amorphous layer of a metal oxide on the substrate;

forming a pattern in the amorphous layer of metal oxide so that only portions of the substrate are covered with the amorphous layer of metal oxide, said pattern being a dielectric portion of the capacitor or the inductor;

heating the pattern in the amorphous layer of metal oxide under conditions sufficient to convert it from amorphous to crystalline; and depositing a metal layer over the dielectric portion of the capacitor or inductor.

2. A method of forming a capacitor or an inductor on a substrate comprising:

providing a substrate;

depositing an amorphous layer of a metal oxide on the substrate;

defining a pattern in the amorphous layer of metal oxide by photolithography and removing portions of said layer so that only portions of the substrate are covered with said layer, said pattern being a dielectric portion of the capacitor or the inductor; and heating the pattern in the amorphous layer of metal oxide under conditions sufficient to convert it from amorphous to crystalline.

3. The method as described in claim 2, wherein the step of forming a pattern further comprises removing portions of the amorphous layer by wet etching.

4. The method as described in claim 2, wherein the step of forming a pattern further comprises removing portions of the amorphous layer by plasma etching.

5. The method as described in claim 1, wherein the step of forming a pattern comprises defining the pattern by using a mask during the step of depositing.

6. A method of forming a capacitor or an inductor on a substrate, comprising:

providing a substrate;

depositing an amorphous layer of a metal oxide on the substrate using a target comprising the stoichoimetric oxide;

forming a pattern in the amorphous layer of metal oxide so that only portions of the substrate are covered with the amorphous layer of metal oxide, said pattern being a dielectric portion of the capacitor or the inductor; and heating the pattern in the amorphous layer of metal oxide under conditions sufficient to convert it from amorphous to crystalline.

7. The method as described in claim 6, wherein the metal oxide comprises $ZrTiO_4$, $(SnZr)TiO_4$, $NiFe_2O_4$, $(NiZn)Fe_2O_4$ or $BaFe_2O_4$.

8. The method as described in claim 6, wherein the step of heating comprises heating at 700–850° C.

9. The method as described in claim 8, wherein the step of heating comprises heating in an oxygen-containing atmosphere.

10. The method as described in claim 6, wherein the step of heating comprises heating certain selected portions of the pattern while remaining portions of the pattern remain unheated.

11. The method as described in claim 10, wherein the step of heating comprises laser annealing.

12. The method as described in claim 6, wherein the semiconducting substrate is silicon or gallium arsenide.

13. A method of forming a capacitor or an inductor on a substrate, comprising:

providing a semiconducting substrate;

sputtering an amorphous layer of a metal oxide on the substrate from a target comprising the stoichoimetric oxide;

forming a pattern in the amorphous layer of one or more metal oxides selected from the group consisting of $ZrTiO_4$, $(SnZr)TiO_4$, $NiFe_2O_4$, $(NiZn)Fe_2O_4$ and $BaFe_2O_4$ so that only portions of the substrate are covered with the amorphous layer of metal oxide, said pattern being a dielectric portion of the capacitor or the inductor;

heating the pattern in the amorphous layer of metal oxide at 700–850° C. to convert it from amorphous to crystalline; and depositing a metal layer over the dielectric portion of the capacitor or inductor.

14. The method as described in claim 13, wherein the steps are performed in the order named.

* * * * *